United States Patent
Numata et al.

(10) Patent No.: US 7,598,817 B2
(45) Date of Patent: Oct. 6, 2009

(54) OSCILLATOR FOR OUTPUTTING DIFFERENT OSCILLATION FREQUENCIES

(75) Inventors: Toshimasa Numata, Yokohama (JP); Alejandro Puel, San Jose, CA (US)

(73) Assignee: Fujitsu Media Devices Limited, Yokohama-shi (JP)

( * ) Notice: Subject to any disclaimer, the term of this patent is extended or adjusted under 35 U.S.C. 154(b) by 109 days.

(21) Appl. No.: 11/645,786

(22) Filed: Dec. 27, 2006

(65) Prior Publication Data

US 2008/0157886 A1    Jul. 3, 2008

(51) Int. Cl.
*H03B 5/12* (2006.01)
*H03B 25/00* (2006.01)

(52) U.S. Cl. .............. 331/49; 331/56; 331/77; 331/117 FE; 331/179

(58) Field of Classification Search .......... 331/46, 331/49, 74, 76, 77, 117 R, 179, 56, 117 FE
See application file for complete search history.

(56) References Cited

U.S. PATENT DOCUMENTS

| | | | | |
|---|---|---|---|---|
| 6,288,615 | B1 * | 9/2001 | Kobayashi | 331/49 |
| 6,549,083 | B2 * | 4/2003 | Kanazawa et al. | 331/76 |
| 6,756,863 | B2 * | 6/2004 | Oita | 333/133 |
| 7,375,601 | B2 * | 5/2008 | Kobayashi | 331/179 |

FOREIGN PATENT DOCUMENTS

| | | |
|---|---|---|
| JP | 2004-64567 A | 2/2004 |
| JP | 2004-235906 A | 8/2004 |
| KR | 10-2003-0070940 A | 9/2003 |

* cited by examiner

*Primary Examiner*—Robert Pascal
*Assistant Examiner*—Levi Gannon
(74) *Attorney, Agent, or Firm*—Arent Fox LLP

(57) ABSTRACT

An oscillator includes: oscillation units (11 through 1n) outputting oscillation signals of different frequencies; a transmission line (15) to which outputs of the oscillation units (11, 12) are connected, the transmission line having a characteristic impedance corresponding to an output impedance of an output terminal (Tout); and a low-pass filter 818) connected between the transmission line (15) and the output terminal.

7 Claims, 5 Drawing Sheets

US 7,598,817 B2

OSCILLATOR FOR OUTPUTTING DIFFERENT OSCILLATION FREQUENCIES

BACKGROUND OF THE INVENTION

1. Field of the Invention

The present invention generally relates to oscillators, and more particularly, to an oscillator having multiple oscillation units capable of outputting different oscillation frequencies.

2. Description of the Related Art

Oscillators, particularly, voltage-controlled oscillators have been used in mobile communication equipment such as PHS (Personal Handyphone System), wireless LAN (Local Area Network), and transceivers.

There is an oscillator capable of oscillating at selectable different frequencies. For example, Japanese Patent Application Publication No. 2004-64567 discloses an oscillator that oscillates at a selected one of three oscillation frequencies. The oscillator having selectable multiple oscillation frequencies may have an unevenness of the power of the output signal and power of harmonic signals over the different oscillation frequencies. Particularly, the power of the output signal relates to the C/N (Carrier to Noise) characteristic. The different powers of the output signal for the different oscillation frequencies result in different C/N characteristics for the different oscillation frequencies.

SUMMARY OF THE INVENTION

An object of the present invention is to restrain variations in the power of the output signal and the C/N ratio over the different oscillation frequencies. According to an aspect of the present invention, there is provided an oscillator including: oscillation units outputting oscillation signals of different frequencies; a transmission line to which outputs of the oscillation units are connected, the transmission line having a characteristic impedance corresponding to an output impedance of an output terminal; and a low-pass filter connected between the transmission line and the output terminal. According to the present invention, the outputs of the oscillation units are matched with the characteristic impedance of the strip line, and are thus matched with the output impedance. Further, the low-pass filter cuts off high-frequency components such as harmonics. It is thus possible to prevent restrain differenToutput power and harmonic power for different oscillation frequencies. The output power can be kept constant for the different oscillation frequencies, the C/N ratio can also be kept constant for the different oscillation frequencies.

BRIEF DESCRIPTION OF THE DRAWINGS

Preferred exemplary embodiments of the present invention will be described in detail with reference to the following drawings, wherein.

DESCRIPTION OF THE PREFERRED EMBODIMENTS

A description will now be given, with reference to the accompanying drawings, of exemplary embodiments of the present invention.

First Embodiment

Figure 1:
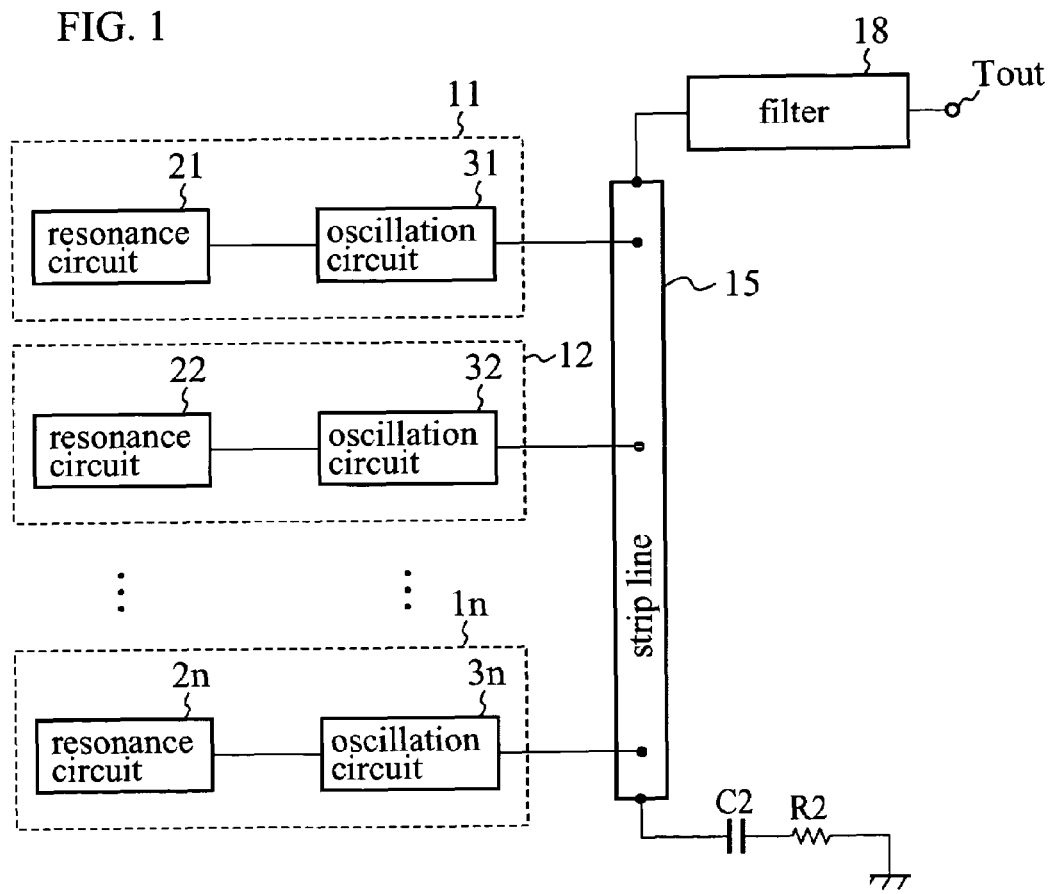
FIG. 1 is a block diagram of an oscillator in accordance with a first embodiment.

FIG. 1 is a block diagram of an oscillator in accordance with a first embodiment. Referring to FIG. 1, the oscillator includes multiple oscillation units 11 through 1n, a strip line 15, a low-pass filter 18, a capacitor C2 and a resistor R2. The oscillation units 11 through in include resonance circuits 21 through 2n and oscillation circuits 31 through 3n, respectively. The outputs of the oscillation units 11 through in are coupled to the strip line 15. The strip line 15 is connected to an output terminal Tout via the low-pass filter 18. The strip line 15 is grounded via the capacitor C2 and the resistor R2.

Figure 2:
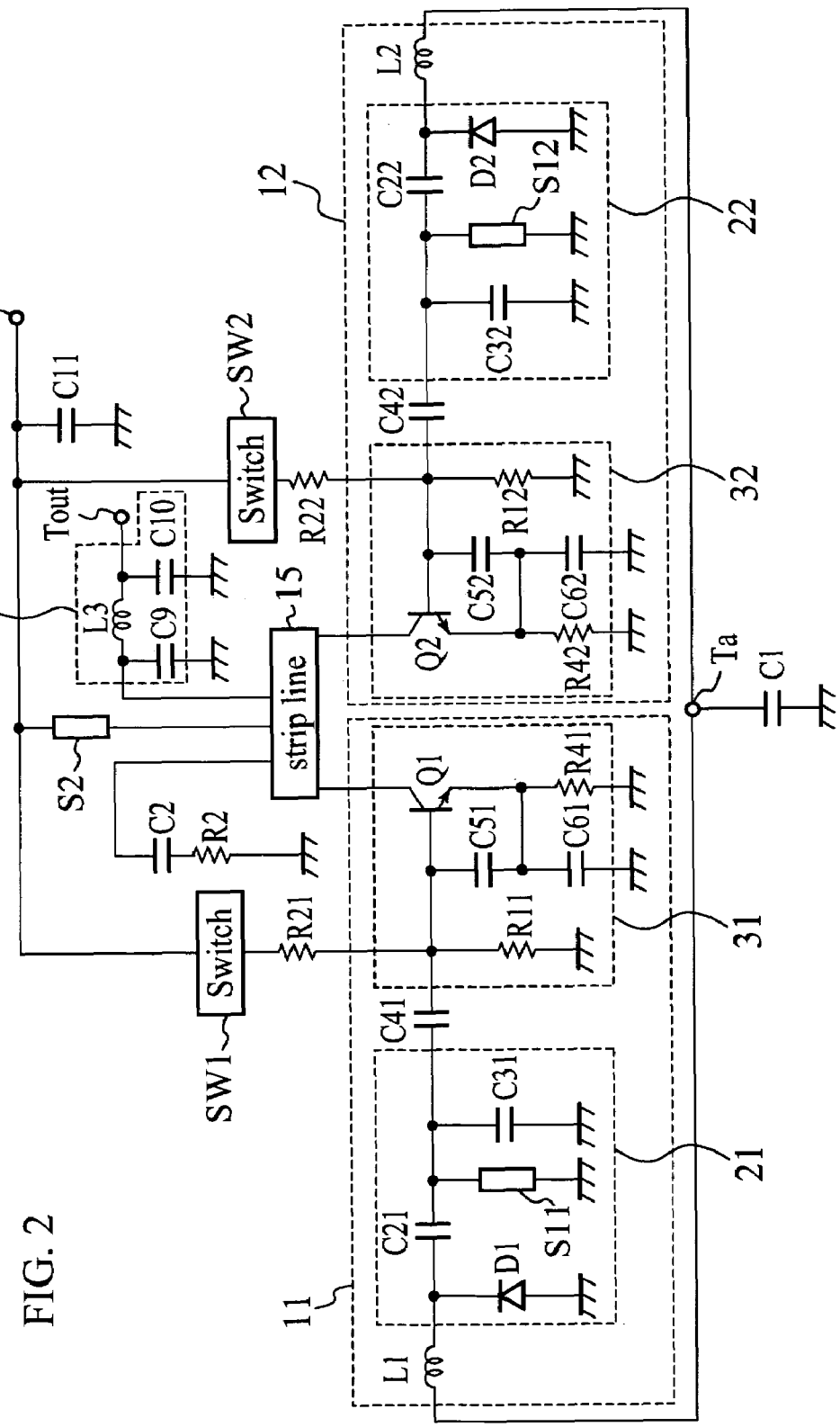
FIG. 2 is a circuit diagram of the oscillator in accordance with the first embodiment.

FIG. 2 is a circuit diagram of the oscillator in accordance with the first embodiment. Referring to FIG. 2, the oscillator includes the oscillation units 11 and 12. The oscillation units 11 and 12 include the resonance circuits 21 and 22 and the oscillation circuits 31 and 32, respectively. The resonance circuits 21 and 22 include variable capacitance diodes D1 and D2, capacitors C21 and C22, capacitors C31 and C32 and lines S11 and S12 like strip lines, respectively. The cathodes of the variable capacitance diodes D1 and D2 are connected to a control terminal Ta via inductors L1 and L2, and the anodes thereof are grounded. Ends of the capacitors C21 and C22 are connected to the cathodes of the variable capacitance diodes D1 and D2. Parallel circuits respectively composed of capacitors C31, C32 and lines S11, S12 are connected between the other ends of the capacitors C21 and C22 and ground. The control terminal Ta is grounded via a capacitor C1. The inductors L1 and L2 and the capacitor C1 remove high-frequency components from a voltage applied to the control terminal Ta, and the resultant DC component voltage is applied to the cathodes of the variable capacitance diodes D1 and D2. When the control voltage applied to the control terminal Ta is changed, the electrostatic capacitances of the variable capacitance diodes D1 and D2 are changed so that the resonance frequencies of the resonance circuits 21 and 22 can be changed. As described above, the resonance circuits 21 and 22 produce the resonance signals regulated at the frequencies defined by the control voltage.

The oscillation circuits 31 and 32 include NPN bipolar transistors Q1 and Q2, capacitors C51 and C52, and capacitors C61 and C62, respectively. The bases of the transistors Q1 and Q2 are connected to the resonance circuits 21 and 22 via coupling capacitors C41 and C42, respectively. The capacitors C51 and C52 are connected in series between the base of the transistor Q1 and ground, and the capacitors C61 and C62 are connected in series between the base of the transistor Q2 and ground. The node between the capacitors C51 and C52 is connected to the emitter of the transistor Q1, and the node between the capacitors C61 and C62 is connected to the emitter of the transistor Q2. The bases of the transistors Q1 and Q2 are connected to switches via resistors R21 and R22, respectively, and are grounded via resistors R11 and R12. The resistors R21 and R11 defines a voltage supplied to the base of the transistor Q1, and the resistors R22 and R12 defines a voltage supplied to the base of the transistor Q2. Resistors R41 and R42 are respectively emitter resistors. The oscillation circuits 31 and 32 thus configured form Clap oscillators, which are a kind of Colpitts oscillator, and generate oscilaltion signals of the resonance frequencies of the resonance circuits 21 and 22.

The bases of the transistors Q1 and Q2 are connected to a power supply terminal Tb via switches SW1 and SW2, respectively. When the switch SW1 is turned ON and the switch SW2 is turned OFF, power is supplied to the oscillation unit 11, which outputs the oscillation signal. In contrast, when the switch SW1 is turned OFF and the switch SW2 is turned ON, power is supplied to the oscillation unit 12, which outputs the oscillation signal.

The collectors of the transistors Q1 and Q2 are connected to the strip line 15. The strip line 15 is grounded via the capacitor C2 and the resistor R2 connected in series. The strip line 15 is connected to the power supply line Tb via choke line S2. The power supply terminal Tb is grounded via the capacitor C11 for use in removal of high-frequency components. The DC power supply voltage is supplied to the collectors of the transistors Q1 and Q2 via the strip line 15. The strip line 15 is connected to the output terminal Tout via the n-type low-pass filter 18 made up of the capacitors C9 and C10 and the inductor L3. The output terminal Tout receives, via the low-pass filter 18, the oscillation signal supplied from one of the transistors Q1 and Q2 that is turned ON by turning ON either one of the switches SW1 and SW2.

Figure 3:
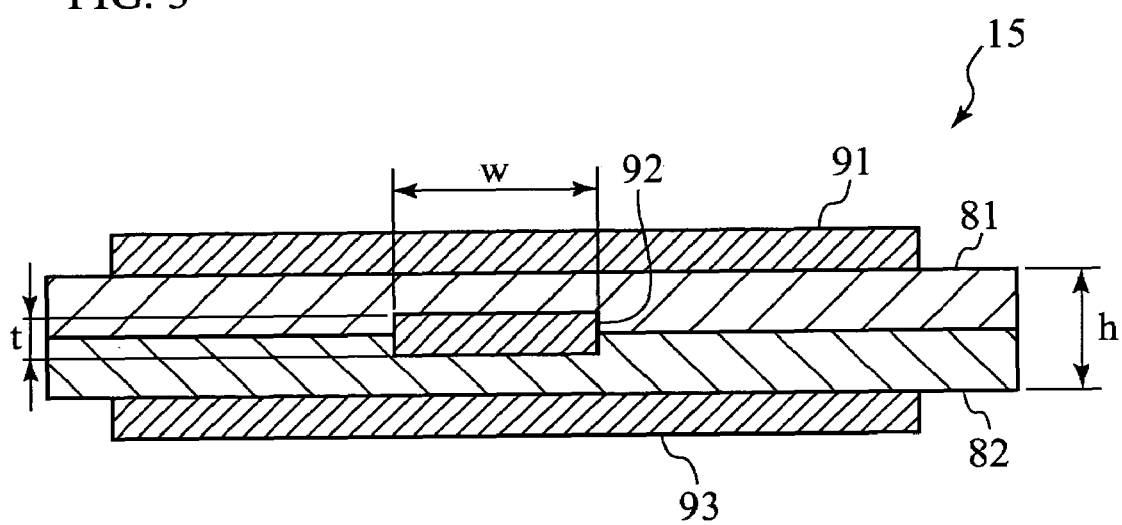
FIG. 3 is a cross-sectional view of a strip line.

FIG. 3 is a cross-sectional view of the strip line 15. The strip line 15 includes dielectric substrates 81 and 82 made of ceramic or glass epoxy on which patterns 91, 92 and 93 formed by a metal film made of, for example, copper are provided. The patterns 91 and 93 are grounded, and the pattern 92 is used as a signal line. The characteristic impedance of the strip line 15 is expressed by Equation 1 as follows:

$$Zo = \frac{60}{\sqrt{\varepsilon_r}} \log \frac{4h}{0.67\pi W(0.8 + t/W)} \quad \text{Equation 1}$$

where h is the thickness of each of the dielectric substrates 81 and 82, t is the thickness of the pattern 92, and W is the width of the pattern 92.

The strip line 15 thus configured can realize an arbitrary characteristic impedance. In the first embodiment, the characteristic impedance ZO of the strip line 15 is made equal to 50 Ω that is the output impedance of the output terminal Tout.

The dielectric substrates 81 and 82 may be made of, for example, glass epoxy. When the dielectric substrates 81 and 82 have a high dielectric constant, the strip line 15 is more affected by the electromagnetic field and is more affected by noise. Thus, the dielectric substrates 81 and 82 are preferably formed by substrates having a dielectric constant lower than that of FR-4 glass epoxy generally used. For example, the dielectric substrates 81 and 82 may be formed by a dielectric substrate having a specific inductive capacity equal to or nearly equal to 3.8.

Figure 4:
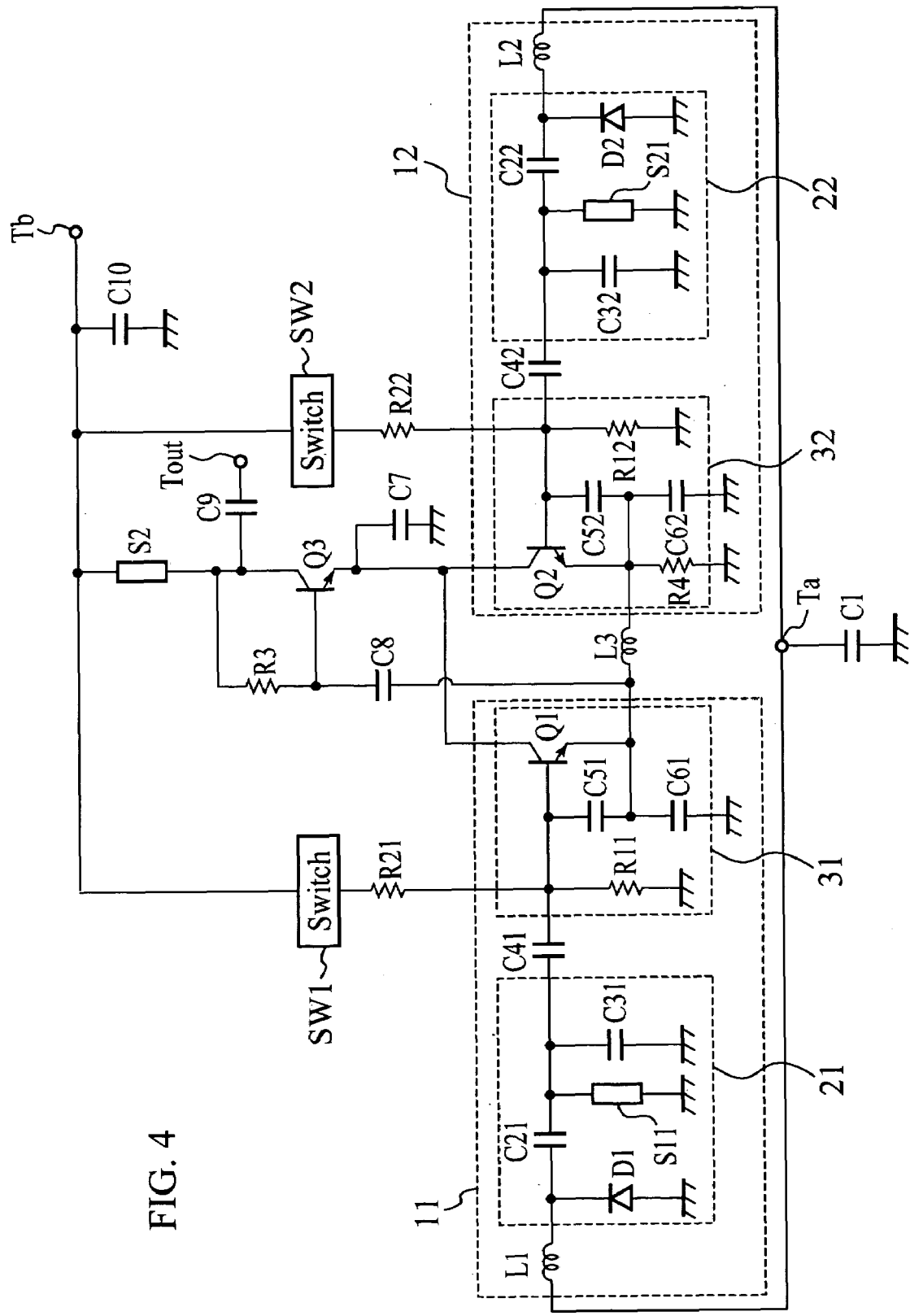
FIG. 4 is a circuit diagram of a comparative oscillator.

An oscillator of a comparative example will now be described in order to emphasize the effects of the oscillator of the first embodiment. Referring to FIG. 4, an oscillator of a first comparative example has an NPN bipolar transistor Q3, which is a buffer-stage transistor. The collectors of the NPN transistors Q1 and Q2 are connected to the emitter of the transistor Q3. The emitters of the transistors Q1 and Q2 are connected via an inductor L3, and are connected to the base of the transistor Q3 via a coupling capacitor C8. Power is supplied to the collector of the transistor Q3 via the line S2. A resistor R3 is connected between the base and collector of the transistor Q3, and a voltage is applied to the base of the transistor Q3. The collector of the transistor Q3 is connected to the output terminal Tout via a capacitor C9. The other structures are the same as those of the first embodiment, and a description thereof will be omitted.

The transistor Q3 is provided in order to reduce the oscillation units 11 and 12 from being greatly affected when the external load of the transistor Q3 changes. It is required that the impedance of the output terminal Tout is, for example, 50 Ω. In the first comparative example, the impedance of the collector of the buffer-stage transistor Q3 is matched with 50 Ω by the capacitor C9. However, the impedance adjustment using the capacitor C9 depends on the frequency. It is thus difficult to equalize the outputs of the oscillation units 11 and 12 that output the different oscillation frequencies to 50 Ω. Thus, the output impedance assumes different values for different oscillation frequencies of the oscillation units 11 and 12. Thus, the different oscillation frequencies of the oscillation units 11 and 12 result in the different impedance matching states between the external circuit and the output terminal Tout, and results in different powers of output signals and different powers of harmonics.

In contrast, according to the first embodiment, as shown in FIGS. 1 and 2, the multiple oscillation units 11 through 1n output the oscillation signals of the mutually different oscillation frequencies. The strip line 15 (transmission line) has the characteristic impedance of the output impedance of the output terminal Tout (for example, 50 Ω). The outputs of the multiple oscillation units 11 and 12 (the collectors of the transistors Q1 and Q2) are connected to the strip line 15. The low-pass filter is connected between the strip line 15 and the output terminal Tout.

With the above structure, the outputs of the oscillation units 11 and 12 are matched with the characteristic impedance of the strip line 15. It is thus possible to match the outputs of the oscillation units 11 and 12 with the output impedance (for example, 50 Ω) irrespective of the frequencies. Thus, the impedance matching between the external circuit and the output terminal Tout constantly has a substantially identical state for any of the oscillation signals of the oscillation units 11 and 12. It is thus possible to maintain the powers of the output signals and those of harmonics of the oscillation units 11 and 12 at respectively identical levels.

The cutoff frequency defined by the capacitors C9 and C10 and the inductor L3 of the low-pass filter 18 may be higher than the oscillation frequency. For example, the cutoff frequency is selected so as to cut off high-frequency components such as harmonic components. The capacitors C9 and C10 may have a capacitance of a few pF, and the inductor L3 may have a few nH.

As described above, according to the first embodiment, the strip line 15 restrains the differences in the output power and harmonic power between the oscillation signal of the oscillation unit 11 and that of the oscillation unit 12. The output power relates to the C/N characteristic. It is thus possible to restrain variations in the C/N ratio for the different oscillation frequencies. Further, the low-pass filter 18 suppresses unnecessary signals of higher frequencies than the oscillation frequency such as harmonics.

The transmission line is required to have the characteristic impedance of the output impedance (for example, 50 Ω), and is preferably the strip line 15 as employed in the first embodiment 1. The characteristic impedance of the transmission line can be set equal to the output impedance (for example, 50 Ω) with the strip line structure as defined by Equation 1.

Preferably, the strip line 15 is grounded via the capacitor C2 (bypass condenser) and the resistor R2 that corresponds to the output impedance of the output terminal Tout. The capacitor C2 is capable of eliminating noise. The resistor R2 is capable of matching the termination resistance with the output impedance.

Preferably, the low-pass filter 18 is a n-type filter composed of the inductor L3 and the two capacitors C9 and C10. If the low-pass filter 18 is formed by a T-type filter, two inductors and one capacitor will be used. The inductors are more expensive than the capacitors. It is thus preferable to use the n-type filter rather than the T-type filter for the low-pass filter 18.

In the first embodiment, the outputs of the oscillation units 11 and 12 are formed by the collectors of the transistors Q1 and Q2, respectively. Nodes other than the collectors may be used when the nodes are used to output the oscillation signals of the oscillation units 11 and 12.

The bases of the transistors Q1 and Q2 are preferably connected to the resonance circuits 21 and 22, respectively. It is thus possible to stabilize the oscillation of the oscillation circuits 31 and 32 at the respective resonance frequencies.

The two capacitors C51 and C52 are connected in series between the base of the transistor Q1 and ground. The node between the two capacitors C51 and C52 is connected to the emitter of the associated transistor Q1. With this structure, a Clap oscillation circuit can be configured.

Second Embodiment

Figure 5:
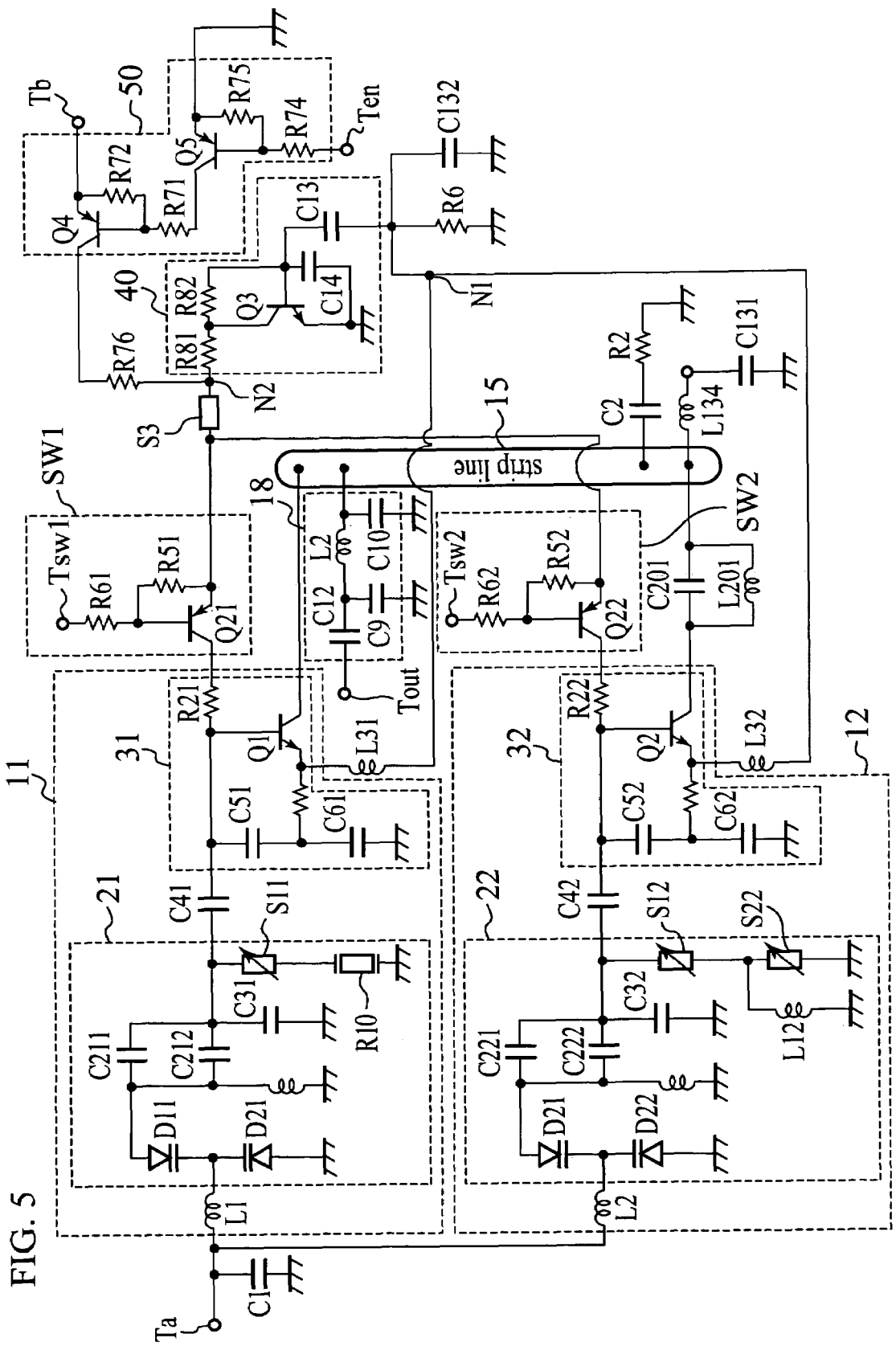
FIG. 5 is a circuit diagram of an oscillator in accordance with a second embodiment.

A second embodiment is an oscillator with a feedback circuit. Referring to FIG. 5, the emitters of the transistors Q1 and Q2 of the oscillation units 11 and 12 are connected to the common node N1 via inductors L31 and L32, respectively. The common node N1 is connected to the base of an NPN bipolar transistor Q3 of a feedback circuit 40 via a coupling capacitor C13. Further, the common node N1 is grounded via a resistor R6 and a capacitor C132 connected in parallel. The resistor R6 functions to adjust current consumed, and the capacitor C132 is used to adjust the balance of the output level. The feedback circuit 40 is an emitter-grounded circuit. The collector of the transistor Q3 is connected to a feedback node N2 via a resistor R81. A resistor R82 is connected between the base and the collector of the transistor Q3, and a capacitor C14 is connected between the base and the emitter of the transistor Q3. The resistor R82 functions to prevent the collector current from leaking to the base. The capacitor C14 is a feedback capacitor. The feedback node N2 is connected to the bases of the transistors Q1 and Q2 of the oscillation circuits 31 and 32 via the line S3 and the switches SW1 and SW2, respectively.

The switch SW1 includes a PNP bipolar transistor Q21, and resistors R51 and R61, and the switch SW2 includes a PNP bipolar transistor Q22, and resistors R52 and R62. The switches SW1 and SW2 are turned ON and OFF in accordance with signals applied to switch terminals Tsw1 and Tsw2, and transfer power to the oscillation circuits 31 and 32, respectively.

A switch circuit 50 is connected between the feedback node N2 and the power supply terminal Tb. The switch circuit 50 includes a switch composed of a PNP bipolar transistor Q4 and resistors R71 and R72, and a switch composed of a PNP bipolar transistor Q5 and resistors R74 and R75. The switch circuit 50 is turned ON and OFF in accordance with an operation signal applied to an operation terminal Ten. When the switch circuit 50 is turned OFF, power supplied to the oscillation units 11 and 12 and the feedback circuit 40 is cut off all at once.

In the resonance circuit 21, a control terminal Ta is connected to the cathodes of the variable capacitance diodes D11 and D21 via the inductor L1. The anode of the variable capacitance diode D21 is grounded, and the anode of the variable capacitance diode D11 is connected to one end of a parallel circuit of capacitors C211 and C212. The other end of the parallel circuit of capacitors C211 and C212 is connected to the coupling capacitor C41. The other ends of the capacitors C211 and C212 are grounded via the capacitor C31 and are further grounded via a series circuit of a line S11 and a dielectric coupling element R10.

In the resonance circuit 22, one end of a parallel circuit of capacitors C221 and C222 is grounded via lines S21 and S22 connected in series. An inductor L12 is connected to the line S22 in parallel. The other structures are the same as those of the resonance circuit 21.

The collector of the transistor Q1 of the oscillation circuit 31 is connected to the strip line 15. The collector of the transistor Q2 of the oscillation circuit 32 is connected to the strip line via a parallel circuit of capacitors C201 and an inductor L201. The strip line 15 is grounded via an inductor L134 and a capacitor C131 connected in series.

The oscillator of the second embodiment has the feedback circuit 40 connected to the emitters of the transistors Q1 and Q2 and fed back to the base of the transistors Q1 and Q2. That is, the signals are fed back to the bases of the transistors Q1 and Q2 from the emitters thereof via the feedback circuit 40. The oscillation signals are output from the collectors of the transistors Q1 and Q2, so that the C/N ratio can be improved.

The emitters of the transistors Q1 and Q2 are connected to the common node N1, and are fed back to-the bases of the transistors Q1 and Q2 via the single feedback circuit 40. It is thus possible to miniaturize the oscillator.

The inductors L31 and L32 function to cut off unnecessary signals of frequencies higher than the oscillation frequency such as harmonics, which signals flow back to the emitters of the transistors Q1 and Q2 from the common node N1.

The first and second embodiments employ the two oscillation units 11 and 12. It is possible to use three or more oscillation units.

Although a few specific exemplary embodiments employed in the present invention have been shown and described, it would be appreciated by those skilled in the art that changes may be made in these exemplary embodiments without departing from the principles and spirit of the invention, the scope of which is defined in the claims and their equivalents.

What is claimed is:

1. An oscillator comprising:
   oscillation units outputting oscillation signals of different frequencies;
   a transmission line to which outputs of the oscillation units are connected, the transmission line having a characteristic impedance corresponding to an output impedance of an output terminal; and
   a low-pass filter connected between the transmission line and the output terminal,
   wherein the transmission line is grounded via a capacitor and a resistor corresponding to the output impedance.

2. The oscillator as claimed in claim 1, wherein the transmission line is formed by a strip line.

3. The oscillator as claimed in claim 1, wherein the low-pass filter is a n-type filter composed of an inductor and two capacitors.

4. The oscillator as claimed in claim 1, wherein:
   the oscillation units respectively include transistors; and
   the outputs of the oscillation units are formed by collectors of the transistors.

5. The oscillator as claimed in claim 4, wherein resonance circuits are connected to bases of the transistors.

6. The oscillator as claimed in claim 4, wherein:
   two capacitors are connected in series between a base of each of the transistors and ground; and
   a node between the two capacitors is connected to the emitter of a corresponding one of the transistors.

7. The oscillator as claimed in claim 4, further comprising a feedback circuit connected to emitters of the transistors and fed back to bases thereof.

* * * * *